(12) United States Patent
Kawanishi et al.

(10) Patent No.: US 9,685,331 B1
(45) Date of Patent: Jun. 20, 2017

(54) SEMICONDUCTOR DEVICE MANUFACTURING METHOD AND PATTERN FORMING METHOD

(71) Applicant: KABUSHIKI KAISHA TOSHIBA, Tokyo (JP)

(72) Inventors: Ayako Kawanishi, Yokohama Kanagawa (JP); Yusuke Kasahara, Yokohama Kanagawa (JP); Hiroki Yonemitsu, Chigasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/231,393

(22) Filed: Aug. 8, 2016

(30) Foreign Application Priority Data

Feb. 29, 2016 (JP) .................................. 2016-037924

(51) Int. Cl.
| | | |
|---|---|---|
| H01L 21/02 | (2006.01) | |
| H01L 21/32 | (2006.01) | |
| H01L 21/027 | (2006.01) | |
| H01L 21/324 | (2006.01) | |
| H01L 21/306 | (2006.01) | |
| H01L 21/308 | (2006.01) | |

(52) U.S. Cl.
CPC ...... *H01L 21/0274* (2013.01); *H01L 21/3085* (2013.01); *H01L 21/30604* (2013.01); *H01L 21/324* (2013.01)

(58) Field of Classification Search
CPC ............. H01L 21/0274; H01L 21/3085; H01L 21/30604; H01L 21/324
See application file for complete search history.

(56) References Cited

U.S. PATENT DOCUMENTS

| | | | | |
|---|---|---|---|---|
| 2014/0273472 | A1* | 9/2014 | Somervell | H01L 21/31144 438/702 |
| 2014/0287587 | A1* | 9/2014 | Lee | B81C 1/00031 438/694 |
| 2014/0291878 | A1 | 10/2014 | Somervell | |
| 2014/0342290 | A1* | 11/2014 | Wu | G03F 7/0035 430/285.1 |

FOREIGN PATENT DOCUMENTS

| | | |
|---|---|---|
| JP | 2014060189 A | 4/2014 |
| JP | 2014157974 A | 8/2014 |
| JP | 2014168001 A | 9/2014 |

* cited by examiner

*Primary Examiner* — Mamadou Diallo
(74) *Attorney, Agent, or Firm* — Patterson & Sheridan, LLP (57) ABSTRACT

A semiconductor device manufacturing method includes forming a first film on a substrate having a first region and a second region. A second film is formed on the first film. Guide grooves are formed by removing portions of the second film and exposing the first film. A self-assembly material is coated on the exposed first film and heated to cause a phase separation into a first and a second phase section. The self-assembly material is irradiated. A mask pattern including at least a portion of the first phase section is formed by removing the second phase section. The mask pattern has a first dimension in the first region and a second dimension in the second region that is different from the first dimension. The first film is etched after the mask pattern is formed.

20 Claims, 11 Drawing Sheets

FIG. 19A  FIG. 19B

SEMICONDUCTOR DEVICE MANUFACTURING METHOD AND PATTERN FORMING METHOD

CROSS-REFERENCE TO RELATED APPLICATION

This application is based upon and claims the benefit of priority from Japanese Patent Application No. 2016-037924, filed Feb. 29, 2016, the entire contents of which are incorporated herein by reference.

FIELD

Embodiments described herein relate generally to a semiconductor device manufacturing method and a pattern forming method.

BACKGROUND

Using self-assembling materials in pattern forming methods, such as directed self-assembly (DSA), has become attractive for the fabrication of electronic components, such as a semiconductor device or a liquid crystal display.

DETAILED DESCRIPTION

According to one embodiment, a semiconductor device manufacturing method includes forming a first film on a substrate having a first region and a second region. A second film is formed on the first film. Guide grooves are formed by removing portions of the second film and exposing the first film. A self-assembly material is coated on the exposed first film and heated to cause a phase separation into a first polymer phase section and a second polymer phase section. The self-assembly material is irradiated on the substrate. A mask pattern including at least a portion of the first polymer phase section is formed by removing the second polymer phase section. The mask pattern has a first dimension in the first region and a second dimension in the second region that is different from the first dimension. The first film is etched after the mask pattern is formed.

First Embodiment

A semiconductor device manufacturing method according to a first embodiment will be described below with reference to FIGS. 1 to 8B. The same features are represented by the same reference numerals in the description of the drawings. However, a relationship between film thickness and horizontal plane dimensions in the drawings is merely schematic, as this relationship may differ in actuality from that depicted.

Figure 1:
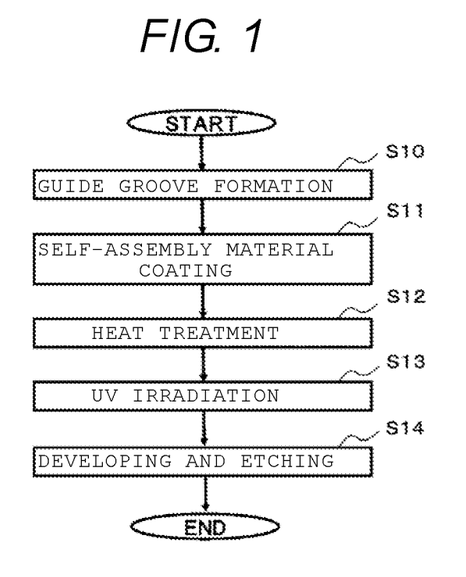
FIG. 1 is a flowchart which illustrates a semiconductor device manufacturing method according to first, second, and third embodiments.

FIG. 1 is a flow chart illustrating a semiconductor device manufacturing method according to a first embodiment. The semiconductor device manufacturing method according to the first embodiment is carried out as guide groove formation (S10), self-assembly material coating (S11), heat treatment (S12), UV irradiation (S13), and developing and etching (S14).

Next, aspects of the flow chart in FIG. 1 will be described with reference to FIGS. 2A to 7B.

Figure 2A:
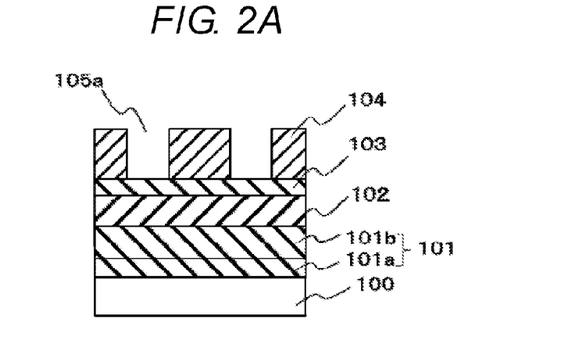
FIGS. 2A to 2C are cross-sectional views which illustrate a first process of the semiconductor device manufacturing method according to the first embodiment.
Figure 2B:
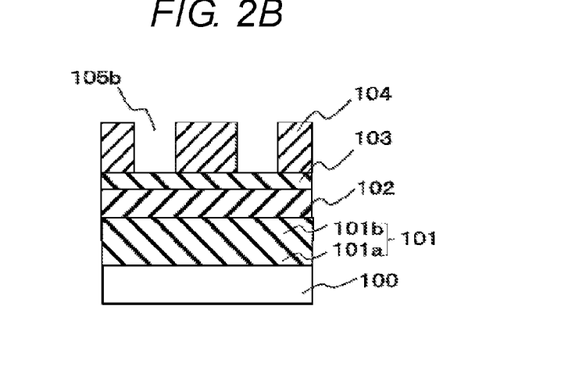
Figure 2C:
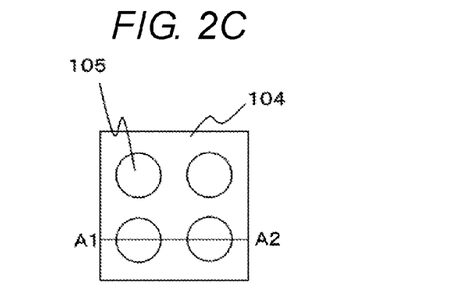

FIGS. 2A and 2B are cross-sectional views respectively illustrating arbitrary cross-sections of a substrate wafer center section and a substrate edge section. The substrate in this instance may be a semiconductor wafer or the like. FIG. 2C is a planar view of FIGS. 2A and 2B. The cross-sectional views in FIGS. 2A and 2B are along line A1-A2 line in FIG. 2C. Substrate center sections and edge sections are similarly shown respectively in FIGS. 3A and 3B to FIGS. 19A and 19B.

FIGS. 2A and 2B illustrate the guide groove formation (S10) process, which is the first process of the semiconductor device manufacturing method in FIG. 1. As shown in FIGS. 2A and 2B, a film to be processed 101 is formed on a substrate 100, and a hard mask 102 and an anti-reflection film 103 are formed thereon, in the order as described.

For example, the substrate 100 is a P-type silicon substrate. The film to be processed 101 has, for example, a film thickness of approximately 300 nm, and includes a silicon dioxide film 101a, which is a gate insulating film, and a polysilicon layer 101b, which is a gate electrode. Hereinafter, description of the silicon dioxide film 101a and the polysilicon layer 101b is omitted in detail, and the silicon dioxide film 101a and the polysilicon layer 101b are collectively referred to as the film to be processed 101.

In one embodiment, for example, the hard mask 102 is a carbon film with film thickness of 100 nm which is formed using a chemical vapor deposition (CVD) process. In addition, for example, the anti-reflection film 103 is an oxide film with a film thickness of 15 nm which is formed by spin coating.

Next, spin coating is performed on the anti-reflection film 103 to form a resist film 104 having, for example, a film thickness of 120 nm. An argon fluoride (ArF) excimer laser irradiates the resist film 104 through a photomask in an immersion lithography process, for example. After this, guide grooves 105a and 105b with a cylindrical shape can be formed in the resist film 104 by removing one of the exposed or unexposed portions of the resist film 104. A diameter of a circular cross-section of the guide grooves 105a and 105b is, for example, 70 nm. The thusly patterned resist film 104 acts as a physical guide for a phase separation of the self-assembly material occurring later in the process.

Figure 3A:
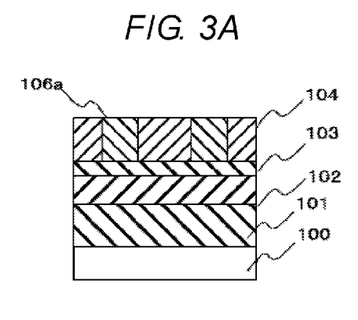
FIGS. 3A and 3B are cross-sectional views which illustrate a second process of the semiconductor device manufacturing method according to the first embodiment.
Figure 3B:
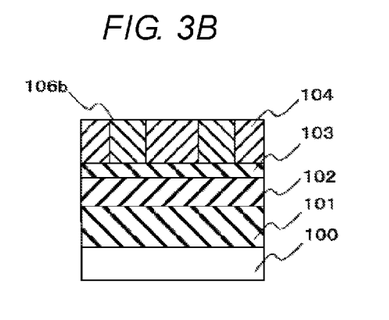

Next, as shown in FIGS. 3A and 3B, the self-assembly material 106a, 106b is coated on the patterned resist film 104 (S11). Self-assembly material 106a and 106b fills the guide grooves 105a and 105b respectively. In one embodiment, for example, the self-assembly material 106a, 106b may be comprised of block copolymers. A block copolymer has a structure in which at least two segments of different polymeric repeat units are in one polymeric chain. However, the self-assembly material may be polymer materials having self-assembly characteristics other than block copolymers.

In the first embodiment, for example, the self-assembly material 106a, 106b is coated on the substrate 100 according to the following method. First, polystyrene-block-poly (methylmethacrylate) copolymers (PS-b-PMMA) formed of polystyrene (PS) segments and polymethylmethacrylate (PMMA) segments are dissolved in a propylene glycol monomethyl ether acetate (PGMEA) solution so as to have a concentration of 1.0 wt % to form a PGMEA solution of the block copolymers. Next, while the substrate 100 is rotated at a rotational speed of 1,500 rpm, the PGMEA solution of the block copolymers is dispensed on to the resist film 104. The substrate 100 is rotated for 30 seconds in the spin coating process and is also subjected to a spin dry process at the rotational speed of 1,000 rpm, making it possible to form the self-assembly material 106a, 106b with substantially uniform film thickness across the substrate 100. The coating method is not limited to the spin coating. For example, an ink jet coating method may be used.

In the present embodiment, the self-assembly material has an average molecular weight (Mn) (number average molecular weight) for PS and PMMA of 4,700 and 24,000 respectively. With these molecular weights, the copolymer will phase separate in a manner so as to forma pattern having a reduced diameter from the guide grooves 105a and 105b (when the guide grooves have a diameter of 50 nm to 100 nm). One the pattern formed by the phase separated copolymer in this example would be cylindrical in each guide groove In the present embodiment, the self-assembly material is comprised of block copolymers PS-b-PMMA, but is not limited thereto. In addition, when the self-assembly material is comprised of block copolymers like in the present embodiment, the molecular weight of the block copolymers or the shape when the phase separation of the block copolymers is carried out, as described below, is selectable in accordance with a desired pattern.

Figure 4A:
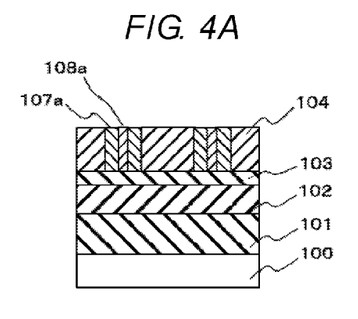
FIGS. 4A and 4B are cross-sectional views which illustrate a third process of the semiconductor device manufacturing method according to the first embodiment.
Figure 4B:
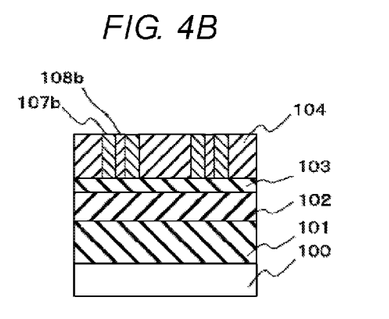

Next, as shown in FIGS. 4A and 4B illustrating the heat treatment process (S12), the substrate 100 is placed on a hot plate, and heated for three minutes at 240° C. Thereby, phase separation of the self-assembly material 106a, 106b is carried out, and the self-assembly material 106a and 106b are separated into first polymer sections 107a and 107b, respectively, in which PS material predominates, and second polymer sections 108a and 108b, respectively, in which PMMA material predominates. The resist film 104 functions as a physical guide during phase separation of a self-assembly material 106a, 106b. The first polymer sections 107a, 107b and the second polymer sections 108a, 108b have a cylindrical shape after the phase separation. For example, the first polymer sections 107a, 107b are formed (segregated) along the side walls of the cylindrical guide grooves 105a and 105b, and second polymer sections 108a, 108b are formed in a cylindrical shape at the center of the guide grooves 105a, 105b. One cylindrical second polymer section 108a, 108b is formed for one guide groove 105a, 105b.

Figure 5A:
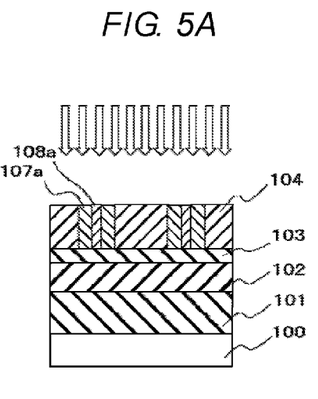
FIGS. 5A and 5B are cross-sectional views which illustrate a fourth process of the semiconductor device manufacturing method according to the first embodiment.
Figure 5B:
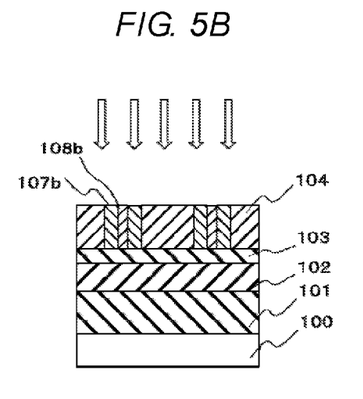
Figure 8A:
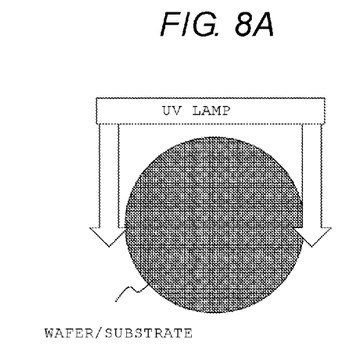
FIGS. 8A and 8B are planar views which illustrate a UV irradiation method according to the first embodiment.
Figure 8B:
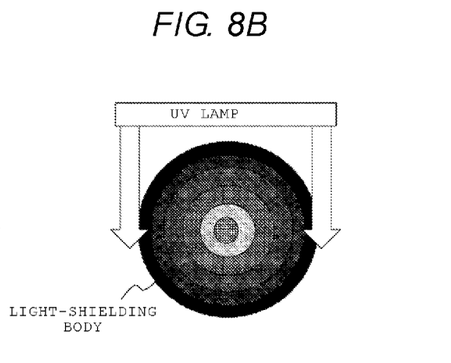

Next, as shown in FIGS. 5A and 5B, UV irradiation is performed on the entire substrate 100 (S13). With respect to the self-assembly material 106a, 106b, the irradiation causes chain scission of the PMMA segments and thus the second polymer section 108a, 108b becomes relatively soluble in isopropyl alcohol (IPA). For example, as shown in FIGS. 8A and 8B, the UV irradiation process is performed in two stages of UV irradiation. First, as shown in FIG. 8A, the entire upper surface of the substrate 100 is irradiated with the same amount of UV radiation (uniform exposure). Here, a UV lamp scans across the substrate 100 in the direction of the arrows shown in FIG. 8A from one end of the substrate 100 to the other end of the substrate 100. Next, as shown in FIG. 8B, the upper surface of the substrate 100 is irradiated with different amounts, with the amount of UV radiation applied to the central section of the substrate 100 being larger than the amount of UV radiation applied to the edge section of the substrate 100. For this second exposure, a light-shielding body can placed on or over the substrate 100, and the UV lamp can move and irradiate in otherwise the same manner as in the first stage process shown in FIG. 8A. The percentage of light that is shielded by the light-shielding body decreases from the edge section to the central section of the light-shielding body. For example, moving from the edge section to the central section of the light-shielding body, the percentage of light shielded decreases gradually from is 90%, 70%, 50%, 30%, 10%, and 0%. For example, in one embodiment, using the two stage UV irradiation method described, the central section is irradiated with 2,000 mJ/cm$^2$ of UV, the edge section is irradiated with 1,000 mJ/cm$^2$ of UV, and an intermediate section between the central section and the edge section is irradiated with 1,500 mJ/cm$^2$ of UV. Here, the radiation amount (dose) is intensity of light with which a section is irradiated per unit area.

Here, the second polymer section 108a become somewhat soluble in IPA due to UV-induced chain scissioning of at least a portion of the PMMA segments, which predominate in the second polymer section 108a. But in the center section, where the UV dose is higher, more chain scissioning occurs and the size of the region receiving what can be considered a threshold dose necessary for becoming soluble in IPA increases as compared to the edge section. For this reason, in the center section, where a UV irradiation amount is large, the diameter of a hole after development is larger, and in the edge section, where a UV irradiation amount is small, the diameter of the hole is smaller.

Figure 6A:
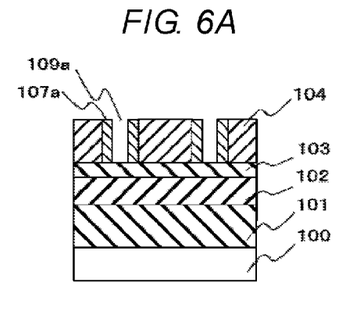
FIGS. 6A and 6B are cross-sectional views which illustrate a fifth process of the semiconductor device manufacturing method according to the first embodiment.
Figure 6B:
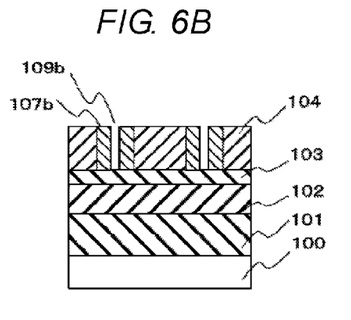

Next, FIGS. 6A to 7B collectively illustrate the developing and etching process (S14). As shown in FIGS. 6A and 6B, the substrate 100 is exposed to IPA after the UV irradiation process, and the polymers soluble in IPA are removed. In the first embodiment, the second polymer sections 108a, 108b, which include a large amount of PMMA, are removed. As a result, cylindrical shaped holes 109a and 109b can be formed in the center of the guide grooves 105a and 105b respectively. The diameter of the hole 109a in the central section where the applied UV radiation amount is relatively large is, for example, 25 nm, and the diameter of the hole 109b in the edge section where the applied UV radiation amount applied is relatively small is, for example, 22 nm. This dimensional difference is generated due to a difference in UV irradiation amount which results in lower effective polymer molecular weights in the high exposure central region as compared to the low exposure edge region.

Figure 7A:
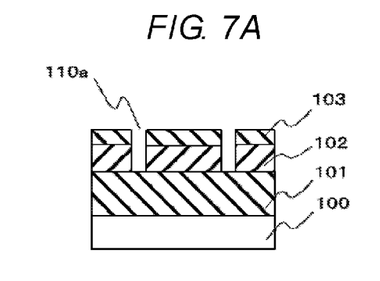
FIGS. 7A and 7B are cross-sectional views which illustrate a sixth process of the semiconductor device manufacturing method according to the first embodiment.
Figure 7B:
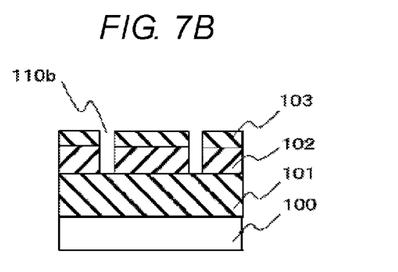

Next, as shown in FIGS. 7A and 7B, the first polymer sections 107a, 107b and the resist film 104 which remain after the development in IPA are used as masks, and the anti-reflection film 103 and the hard mask 102 are processed by reactive ion etching (RIE). The hole 109a and the hole 109b are transferred into the anti-reflection film 103 and the hard mask 102, and holes 110a and 110b are respectively formed. Under the process transfer conditions in the present embodiment, an etching rate is larger in the edge section than in the central section. For this reason, the diameter of the resulting hole 110b formed in the hard mask 102 and the anti-reflection film 103 in the edge section is 25 nm, which is expanded by 3 nm with respect to the initial hole pattern 109b (which was 22 nm). The diameter of the hole 110a formed in the hard mask 102 and the anti-reflection film 103 in the central section also a diameter of 25 nm because the differential central/edge etch rate conditions are such that no expansion from the initial diameter of holed 109a occurs during the pattern transfer process. By this method, a pattern of holes 110a, 110b with uniform dimensions (for example, all holes having a diameter of 25 nm) is formed across the upper surface of the substrate 100.

In the first embodiment, the UV irradiation amount simply differs in the center section and the edge section by use of a light-shielding body in which results in a relatively small difference in total exposure from the edge section to the center section, and by this technique the pattern dimensions after transfer processing are corrected to be uniform across the wafer, but the change in UV irradiation amount across the wafer is not limited to this particular pattern in which dose is merely varied in a wafer center section and an edge section, and may be appropriately changed as necessary to adjust or correct transferred patterns as considered desirable. Here, across wafer differences in the etching rate of the wafer was considered, and the irradiation amount across the wafer was adjusted such that the diameters of holes 109a and 109b would be different to compensation for the known differences in etch rate uniformity across the wafer surface.

In a case where an etching rate in the edge section is larger than an etching rate in the central section, if the holes 109a and 109b are formed with uniform diameters, upon transfer as described above with respect to FIG. 7A and FIG. 7B, the diameter of the hole 110b in the edge section after transfer will be larger than the diameter of the hole 110a in the central section after transfer. Thus, to forma pattern with uniform hole 110a, 110b dimensions, the diameter of the hole 109a in the central section and the diameter of the hole 109b in the edge section must be differentiated to account for the larger etching rate in the edge section compared to the etching rate in the central section.

The present embodiment describes a case where an etching rate is larger in the edge section in comparison to the central section, and the UV radiation amount is thus larger in the central section in comparison to the edge section, but the present disclosure is not limited thereto. It is also possible for the etching rate to be largest in the central section or an intermediate section between the central section and the edge section. In such a case where the etching rate is largest in the central section, the UV radiation amount in the central section may be smaller in comparison to the edge section. In a case where the etching rate is largest in the intermediate section, the UV radiation amount may be smaller in the intermediate section compared to the UV radiation amount in the central section and the edge section.

In addition, in the present embodiment, a case where the resist film 104 was used to form the guide grooves 105a, 105b is described, but the disclosure is not limited thereto. In some embodiments, a pattern in resist film 104 can be transferred to the hard mask 102 and the anti-reflection film 103 and these patterned layers (102 and 103) may be used to form the guide groove 105a, 105b.

Furthermore, the use of guide grooves for pattern formation is not limited to the formation of holes or holes having only a single intended diameter, but can also be used to form line-and-space patterns or any other pattern in which self-assembly can be performed. That is, in a case of the line-and-space pattern, control may be carried out such that the line-and-space pattern is formed in which space widths (as opening dimensions) are different from each other in the stage illustrated in FIGS. 6A and 6B. Control of the dimensions of another pattern may also be carried by differing the opening dimensions.

Second Embodiment

Next, a second embodiment is described with reference to FIGS. 9A to 13B.

The second embodiment describes a semiconductor device manufacturing method similar to the method described in the first embodiment, however, instead of varying the UV radiation amount as in the first embodiment, the film thickness of the self-assembly material 106a, 106b is varied. Accordingly, in the description of the second embodiment below, the portions of the method that are different from the first embodiment are described.

The guide groove is formed using the same method as in the first embodiment (S10).

Figure 9A:
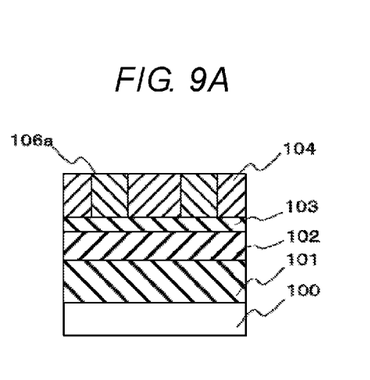
FIGS. 9A and 9B are cross-sectional views which illustrate a first process of the semiconductor device manufacturing method according to the second embodiment.
Figure 9B:
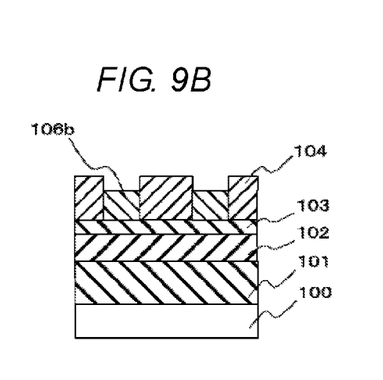

Next, the self-assembly material coating process (S11) according to the second embodiment is described, as illustrated in FIGS. 9A and 9B. The PGMEA solution of the block copolymers is formed the same as in the first embodiment. The PGMEA solution is dispensed on to the patterned resist film 104 while the substrate 100 is rotated at a rotational speed of 1,000 rpm, which is slower than in the first embodiment. The substrate 100 is rotated for 30 seconds in the spin coating process and is then subjected to a spin dry at a rotational speed of 1,000 rpm. In the spin coating method here, the PGMEA solution of the block copolymers is dispensed onto the central section and spreads to the edge section due to centrifugal force. For this reason, in a case where the rotational speed is low, the centrifugal force applied to the substrate 100 is weak, and the self-assembly material 106a, 106b tends not to spread to the edge section, and instead the PGMEA solution of the block copolymers is retained in the central section somewhat. As shown in FIGS. 9A and 9B, the coating film thickness is larger in the central section due to this coating method, such that the self-assembly material 106a in the central section has a larger thickness than the self-assembly material 106b in the edge section. The self-assembly material 106a, 106b in the present embodiment is comprised of block copolymers, but again is not limited thereto.

Figure 10A:
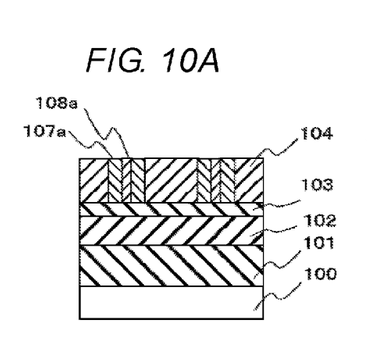
FIGS. 10A and 10B are cross-sectional views which illustrate a second process of the semiconductor device manufacturing method according to the second embodiment.
Figure 10B:
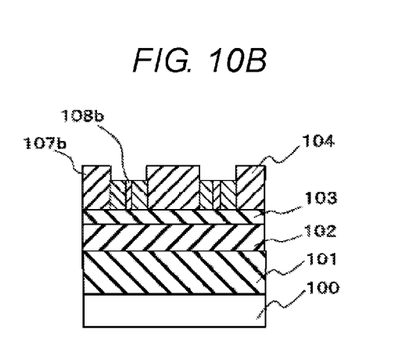

Next, the heat treatment process (S12) according to the second embodiment is described, as illustrated in FIGS. 10A and 10B. As shown in FIGS. 10A and 10B, the substrate 100 is placed on a hot plate, as was also the case in the first embodiment, and heated for three minutes at 240° C. Phase separation of the self-assembly material 106a and 106b occurs during the heat treatment. The first polymer sections 107a and 107b which include a large amount of PS are formed (segregated) along the sidewalls of the cylindrical guide grooves 105a and 105b respectively, and the second polymer sections 108a and 108b which include a large amount of PMMA are formed in a cylindrical shape at the center of the guide grooves 105a and 105b respectively. In the central section, having the larger self-assembly material 106a thickness, the diameter of the second polymer section 108a is larger than the diameter of the second polymer section 108b in the edge section, having the smaller self-assembly material 106b thickness.

Figure 11A:
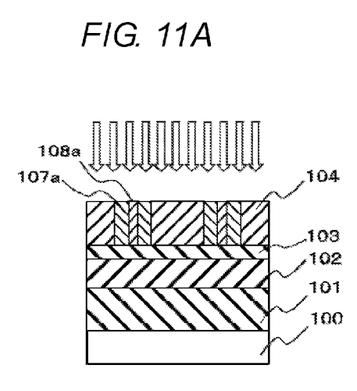
FIGS. 11A and 11B are cross-sectional views which illustrate a third process of the semiconductor device manufacturing method according to the second embodiment.
Figure 11B:
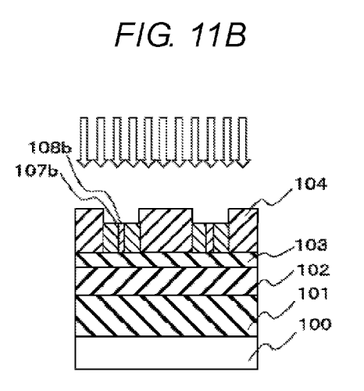

Next, the UV irradiation process (S13) according to the second embodiment is described, as illustrated in FIGS. 11A and 11B. When UV irradiation is performed, PMMA segments are cut and the second polymer sections 108a, 108b are set to be soluble in isopropyl alcohol (IPA). Unlike the first embodiment, which has two stages of UV irradiation, UV irradiation is performed in only one stage in the second embodiment. A uniform radiation amount is applied to the upper surface of the substrate 100. For example, in one embodiment, the dose is 2,000 mJ/cm$^2$.

Figure 12A:
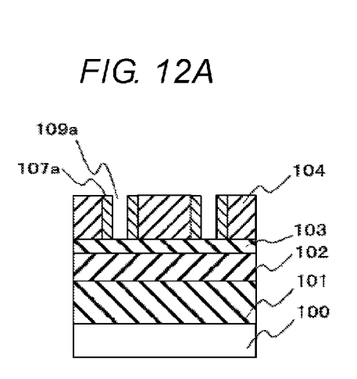
FIGS. 12A and 12B are cross-sectional views which illustrate a fourth process of the cross-semiconductor device manufacturing method according to the second embodiment.
Figure 12B:
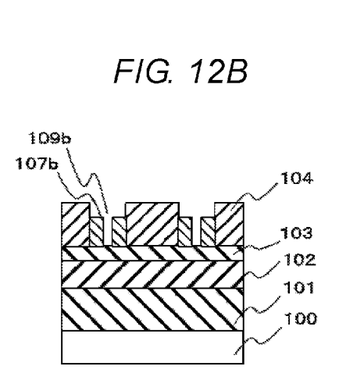

Next, the developing and etching process (S14) according to the second embodiment is described, as illustrated in FIGS. 12A to 13B. As shown in FIGS. 12A and 12B, the substrate 100 is exposed to IPA, and the polymers soluble in IPA are removed, forming holes 109a and 109b. The diameter of the hole 109a in the central section is, for example, 25 nm, and the diameter of the hole 109b in the edge section is, for example, 22 nm. This dimensional difference is due to a difference in coating film thickness of the self-assembly material 106a and 106b in the central and edge sections respectively.

Figure 13A:
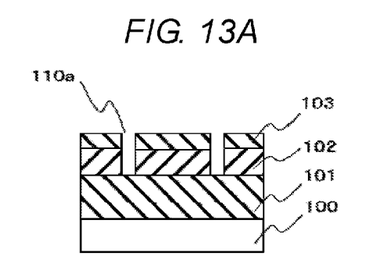
FIGS. 13A and 13B are cross-sectional views which illustrate a fifth process of the semiconductor device manufacturing method according to the second embodiment.
Figure 13B:
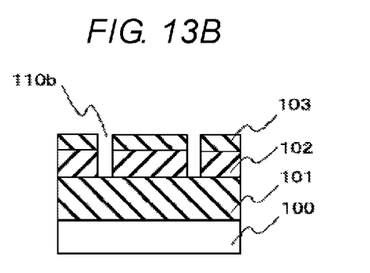

Next, as shown in FIGS. 13A and 13B, the first polymer sections 107a and 107b and the resist film 104 which remain after the exposure to IPA are used as masks, and the anti-reflection film 103 and the hard mask 102 are processed by RIE. The hole 109a and the hole 109b are transferred to the anti-reflection film 103 and the hard mask 102. Under the transfer processing conditions in the present embodiment, the etching rate is larger at the edge section than in the central section. For this reason, the diameter of the hole 110b which is transferred to the hard mask 102 and the anti-reflection film 103 is expanded by 3 nm with respect to the hole 109b from which it was transferred, such that the diameter of the hole 110b is 25 nm. The diameter of the hole 110a which is transferred to the hard mask 102 and the anti-reflection film 103 in the central section has the same diameter of 25 nm as the hole from which it was transferred 109a. By this method, a pattern of holes 110a, 110b with uniform dimensions (for example, all holes having a diameter of 25 nm) is formed in the plane of the upper surface of the substrate 100.

In the second embodiment, the difference in film thickness of the self-assembly material 106a and 106b can be controlled by adjusting the rotational speed, the spin coating time, and/or the amount of material used in the spin coating. The method of controlling the coating film thickness is not limited to this method. For example, the self-assembly material 106a, 106b of a desired amount may be discharged from a nozzle using an ink jet coating process. In addition, the film thickness difference may be achieved by controlling an amount of flow of the self-assembly material 106a and 106b into the guide grooves 105a and 105b respectively. For example, a surface of the resist film 104 of a region in which the film thickness is to be reduced can be made hydrophilic by UV irradiation or the like. In the location of the hydrophilic surface of the resist film 104 within the guide grooves 105a, 105b, the PGMEA solution with the hydrophobic self-assembly material tends not to flow, and as a result, the film thickness is smaller than if the self-assembly material were to fill guide grooves 105a, 105b without surface energy modification of any part of the resist film 104.

In the semiconductor device manufacturing method according to the second embodiment, there is a difference in the film thickness of the self-assembly material in the center section and edge section of the wafer. This difference is provided in consideration of a predetermined difference in the etching rate of materials in the edge section and in the center section. Because the film thickness of the self-assembly material 106a is greater, the diameter of the second polymer section 108a is increased as compared to the diameter of the second polymer section 108b in edge section where the film thickness of the self-assembly material is lesser. As a result, even in a case where the etching rate is greater in the edge section than the center section, a uniform diameter hole pattern in the underlying layers can still be formed across the wafer.

In the second embodiment, because the etching rate is larger in the edge section in comparison to the central section, the coating film thickness (of self-assembly material) is controlled to be smaller in the edge section and larger in the central section. However, if the etching rate were largest in the central section or an intermediate section between the central section and the edge section, the coating film thickness of the self-assembly material for each section may be appropriately selected so as to correct the applicable etching rate. For example, if the etching rate is largest in the central section, the coating film thickness of the self-assembly material may be smaller in the central section than in the edge section, and in a case where the etching rate is largest in the intermediate section between the central section and the edge section, the film thickness of the self-assembly material may be smaller in the intermediate section compared to the central section and the edge section.

In addition, the guide grooves 105a, 105b need not be comprised of remaining portions of resist film 104 and may instead be comprised of remaining portions of the hard mask 102 and/or the anti-reflection film 103 after the pattern of the resist film 104 has been transferred to at least one of those underlying layers.

Third Embodiment

Next, the third embodiment is described with reference to FIGS. 14A to 19B.

The third embodiment describes a semiconductor device manufacturing method similar to the methods described in the first and second embodiments; however, instead of varying the UV dose or the film thickness of the self-assembly material 106a, 106b, as in the first and second embodiments respectively, the diameter of the guide grooves is also purposively varied. Accordingly, in the description of the forming method below, differences from the first and second embodiments are described.

Figure 14A:
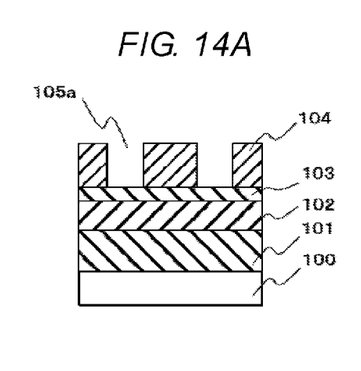
FIGS. 14A and 14B are cross-sectional views which illustrate a first process of the semiconductor device manufacturing method according to the third embodiment.
Figure 14B:
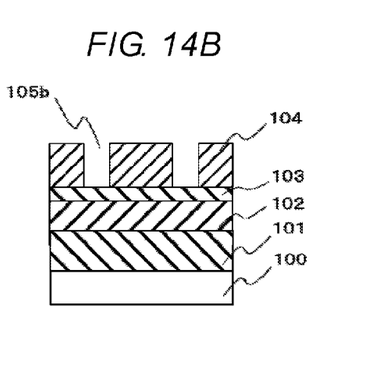

FIGS. 14A and 14B illustrate the guide groove formation process (S10) that is the first process of the semiconductor device manufacturing method according to the third embodiment. As shown in FIGS. 14A and 14B, a resist film 104 is spin coated such that the resulting resist film thickness is 120 nm. The resist film 104 is formed on the anti-reflection film 103, which is formed on the film to be processed 101 and the hard mask 102, which are on the substrate 100. After this, an ArF excimer laser selectively irradiates portions of the resist film 104 in an immersion lithography process, for example. The radiation amount of the ArF light, for example, is adjusted such that the amount of exposure is 20 mJ/cm$^2$ in the wafer central section and the amount of exposure is 18 mJ/cm$^2$ in the edge section. Where radiation amount is smaller the diameter of the guide groove ultimately formed will be smaller. By this lithography process, guide grooves 105, 105b having a cylindrical shape are formed in the resist film 104 after development. After formation, the diameter of the circular cross-section guide groove 105a in the central section is, for example, 70 nm, which is larger than the diameter of the circular cross-section of the guide groove 105b in the edge section, which is, for example, 65 nm.

Figure 15A:
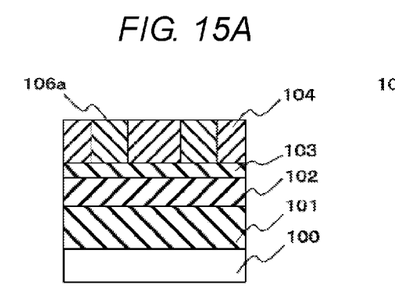
FIGS. 15A and 15B are cross-sectional views which illustrate a second process of the semiconductor device manufacturing method according to the third embodiment.
Figure 15B:
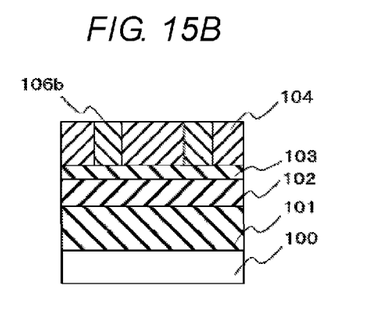

Next, as shown in FIGS. 15A and 15B, self-assembly material 106a, 106b is coated (S11) using the same process as in the first embodiment, with the same amount of self-assembly material 106a and 106b coated in the central section and the edge section respectively.

Figure 16A:
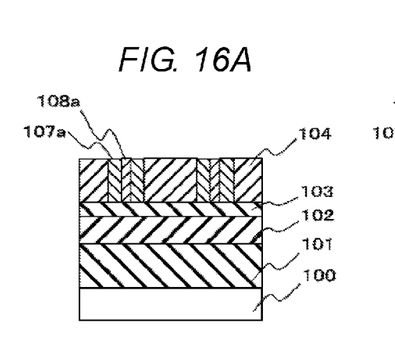
FIGS. 16A and 16B are cross-sectional views which illustrate a third process of the semiconductor device manufacturing method according to the third embodiment.
Figure 16B:
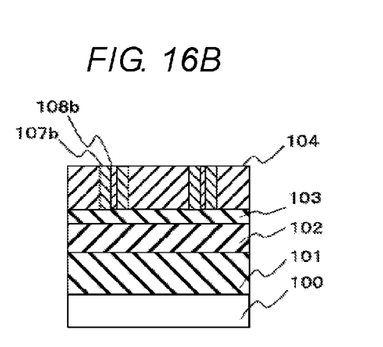
Figure 17A:
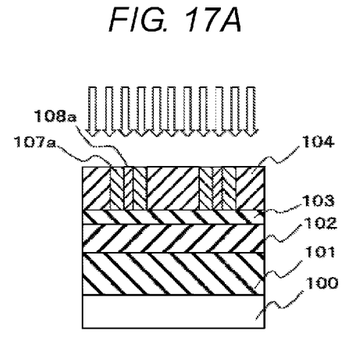
FIGS. 17A and 17B are cross-sectional views which illustrate a fourth process of the semiconductor device manufacturing method according to the third embodiment.
Figure 17B:
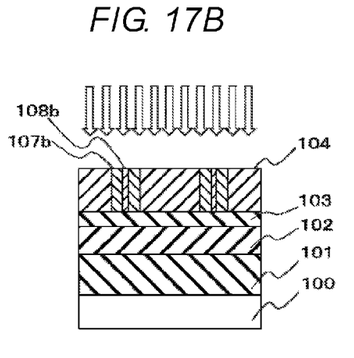

After this, as shown in FIGS. 16A and 16B, heat treatment (S12) using the same method as in the first and second embodiments causes phase separation of the self-assembly material 106a, 106b. At this time, because the diameter of the guide groove 105b in the edge section is smaller than the diameter of the guide groove 105a in the central section, and the diameter of the second polymer section 108b in the edge section is smaller than the diameter of the second polymer section 108b in the central section.

Figure 18A:
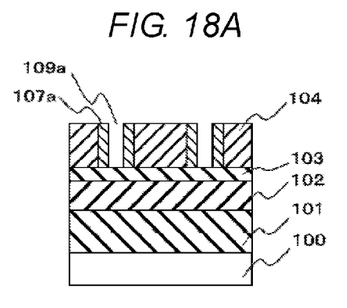
FIGS. 18A and 18B are cross-sectional views which illustrate a fifth process of the semiconductor device manufacturing method according to the third embodiment.
Figure 18B:
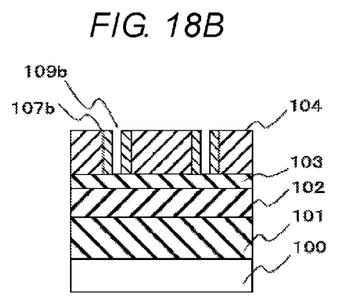

Next, as shown in FIGS. 17A to 18B, the UV irradiation process (S13) is performed using the same process as described for the second embodiment. After this, the developing and etching process (S14) is performed, as illustrated in FIGS. 18A to 19B. As shown in FIGS. 18A and 18B, the substrate 100 is exposed to IPA, and the second polymer sections 108a and 108b are removed, forming holes 109a and 109b respectively. At this time, the diameter of the hole 109a in the central section is, for example, 25 nm, and the diameter of the hole 109b in the edge section is, for example, 22 nm. This dimensional difference is due to a difference in the diameter of the second polymer sections 108a and 108b, which is due to a difference of the diameter of the guide grooves 105a and 105b, as described above.

Figure 19A:
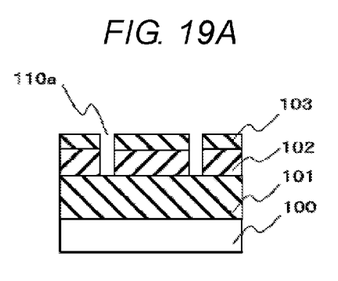
FIGS. 19A and 19B are cross-sectional views which illustrate a sixth process of the semiconductor device manufacturing method according to the third embodiment.
Figure 19B:
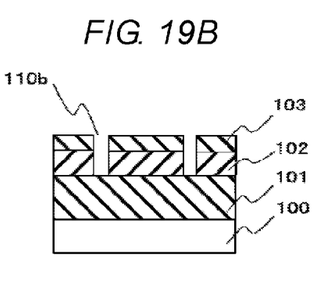

Finally, as shown in FIGS. 19A and 19B, etching is performed using the process as described for the first and second embodiments. Under the transfer processing conditions in the third embodiment, the etching rate is larger at the edge section than in the central section. For this reason, the diameter of the hole 110b which is transferred to the hard mask 102 and the anti-reflection film 103 in the edge section is expanded by 3 nm with respect to the hole from which it was transferred 109b, such that the diameter for the hole 110b is 25 nm. The diameter of the hole 110a which is transferred to the hard mask 102 and the anti-reflection film 103 in the central section has the same diameter of 25 nm as the hole from which it was transferred 109a.

In the semiconductor device manufacturing method according to the third embodiment, the guide groove 105b in the edge section is particularly formed with a smaller diameter to compensate for the larger etching rate in the edge section. Because the diameter of the guide groove 105b in the edge section is smaller, the diameter of the second polymer section 108b formed the edge section during the heat treatment will be smaller, and consequently the diameter of the hole 109b formed after removal of the second polymer section 108b is smaller. Accordingly, the larger etching rate in the edge section, does not result in the hole 110b being larger than the hole 110a after transfer. Rather, a pattern of holes 110a, 110b with uniform dimensions (for example, all holes having a diameter of 25 nm) is formed in the plane of the upper surface of the substrate 100.

In the semiconductor device manufacturing method in the first, second, and third embodiments described above, the UV radiation amount in the first embodiment, the film thickness of the self-assembly material in the second embodiment, and the diameter of the guide groove in the third embodiment are made to differ between the central section and the edge section of the substrate 100 by some amount to compensate for known or predetermined differences in etch rates for the different regions. As a result, uniform pattern dimensions are achieved in the plane of an upper surface of the semiconductor device after the etching process. The present disclosure is not limited to the specific examples described herein. Embodiments are not limited to process seeking across wafer uniformization of a particular pattern dimension, but rather may be aspects of the example embodiments might be adopted to specifically provide different pattern sizes across the substrate in an arbitrary manner. Note also, the example embodiments of semiconductor device manufacturing methods described herein can also be to be used in combination with each other. For example, in a case where an etching rate is exceptionally large in the edge section in comparison to the central section, both the UV radiation amount and the coating film thickness of the self-assembly material could be changed in the edge section compared to the central section, using methods from both the first and second embodiments.

In addition, the heat treatment (S12) is not limited to the processes described above with respect to the first, second, and third embodiments. During the heat treatment, the wafer can be baked on a hot plate, but when the baking time is longer, the diameter of the second polymer sections 108a, 108b formed during phase separation of the self-assembly material 106a, 106b is smaller. For this reason, in the first, second, and third embodiments, it is possible to accommodate for an exceptionally large etching rate in the edge section by having a longer baking time in the edge section compared to the central section. For example, when the etching rate is exceptionally large in the edge section, the baking time of the edge section may be, for example, two minutes, and the baking time of the central section may be, for example, one minute. This will result in an exceptional difference in the larger diameter of the hole 109a in the central section compared to the smaller diameter of the hole 109b in the edge section, formed during the developing process, to accommodate for the exceptionally large etching rate in the edge section applied during the etching process. Additionally, a hot plate on which the substrate bakes during the heat treatment process may have a temperature setting in each region, and a temperature of only the central section may be lowered during baking to accommodate for the exceptionally large etching rate in the edge section.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising:
   forming a first film on a substrate having a first region and a second region;
   forming a second film on the first film;
   forming guide grooves by removing portions of the second film and exposing the first film;
   coating a self-assembly material on the exposed first film;
   heating the self-assembly material to cause a phase separation of the self-assembly material into a first polymer phase section and a second polymer phase section;
   irradiating the self-assembly material on the substrate;
   forming a mask pattern including at least a portion of the first polymer phase section, by removing the second polymer phase section after irradiating the substrate, the mask pattern having a first dimension in the first region and a second dimension in the second region that is different from the first dimension; and
   etching the first film after forming the mask pattern.

2. The method according to claim 1, wherein the first region of the substrate is irradiated with a different amount of light than the second region of the substrate.

3. The method according to claim 2, wherein the first region of the substrate includes a center portion of the substrate, and the second region of the substrate includes an edge portion of the substrate.

4. The method according to claim 1, wherein the coating of the self-assembly material is performed by spin coating or ink jet coating.

5. The method according to claim 1, wherein heating the substrate includes at least one of:
   heating the first and second regions of the substrate for different amounts of time, and
   heating the first and second regions of the substrate at different temperatures.

6. The method according to claim 1, wherein the self-assembly material is coated on the exposed film in a different amount in the first region of the substrate than in the second region of the substrate.

7. The method according to claim 1, wherein a dimension of the guide grooves formed by removing portions of the second film in the first region of the substrate is different from a dimension of the guide grooves formed by removing portions of the second film in the second region of the substrate.

8. The method according to claim 7, wherein the guide grooves are cylindrical shaped, and the dimension of the guide grooves that is different in the first and second regions is a diameter.

9. The method according to claim 1, wherein the second polymer phase section is removed by exposing the substrate to isopropyl alcohol (IPA).

10. The method according to claim 1, wherein the self-assembly material comprises a block copolymer.

11. The method according to claim 1, further comprising:
    irradiating the self-assembly material on the substrate in a two stage exposure process such that the self-assembly material is uniformly irradiated in the central and peripheral regions in one stage of the exposure process and differentially irradiated in the central and peripheral regions in another stage, wherein at least one stage of the two-stage exposure process is performed after heating the self-assembly material.

12. A pattern forming method, comprising:
    forming a first film on a central region of a substrate and a peripheral region of the substrate;
    forming a second film on the first film;
    patterning the second film to form guide grooves in the central region and the peripheral region of the substrate;
    coating a self-assembly material on the substrate to at least partially fill each guide groove with the self-assembly material;
    causing the self-assembly material in the guide grooves to phase separate into a pattern having a first polymer phase section and a second polymer phase section, wherein a dimension of the second polymer phase section in a guide groove in the central region of the substrate is different from a dimension of the second polymer phase section in a guide groove in the peripheral region of the substrate;
    removing the second polymer phase section from the guide grooves; and
    etching the first film after removing the second polymer phase section from the guide grooves using at least a portion of the first polymer phase section as a mask.

13. The method according to claim 12, further comprising:
    irradiating the self-assembly material on the substrate such that the self-assembly material on the central region of the substrate receives a higher dose than the self-assembly material on the peripheral region of the substrate.

14. The method according to claim 12, wherein the guide grooves are cylindrical and the first polymer phase section surrounds the second polymer phase section in the guide grooves.

15. The method according to claim 12, wherein the coating of the self-assembly material is performed by spin coating or ink jet coating.

16. The method according to claim 12, wherein the guide grooves comprise a line and space pattern.

17. The method according to claim 12, wherein the coating of the self-assembly material is performed such that the guide grooves are filled to a different extent in the central and peripheral regions of the substrate.

18. The method according to claim 12, wherein guide grooves formed in the central region have a different dimension from guide grooves formed in the peripheral region.

19. The method according to claim 18, wherein the guide grooves are cylindrical shaped, the dimension is a diameter of the cylindrical shape, and the diameter of the guide grooves in the central region is greater than the diameter of the guide grooves in the peripheral region.

20. A semiconductor device manufacturing method, comprising:
- forming guide grooves in a first region of a first film and a second region of the first film;
- at least partially filling the first and second guide grooves with a self-assembly material that phase separates into a first phase and a second phase when heated;
- heating the self-assembly material in the guide grooves to cause phase separation and provide a phase pattern within guide grooves, the phase pattern comprising a first phase portion and a second phase portion;
- irradiating the self-assembly material to cause the first and second phases portions to have a different solubility from each other in a developer;
- removing the second phase portion from guide grooves in the first and second regions to provide a etch mask having a pattern dimension in the first region that is different from a pattern dimension in the second region; and
- etching the first film using the etch mask, wherein
- a difference in the pattern dimensions of the etch mask in the first and second regions is set to compensate for differences in etch rates of the first film in the first region and the second region so as to provide an etched pattern in the first film having a same dimension in the first and second regions.

* * * * *